(12) United States Patent
Yamazaki et al.

(10) Patent No.: US 8,609,199 B2
(45) Date of Patent: Dec. 17, 2013

(54) CARBON NANOTUBE GROWING PROCESS, AND CARBON NANOTUBE BUNDLE FORMED SUBSTRATE

(75) Inventors: Yuichi Yamazaki, Tokyo (JP); Tadashi Sakai, Kanagawa (JP); Naoshi Sakuma, Kanagawa (JP); Masayuki Katagiri, Kanagawa (JP); Mariko Suzuki, Kanagawa (JP); Shintaro Sato, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 861 days.

(21) Appl. No.: 12/689,515

(22) Filed: Jan. 19, 2010

(65) Prior Publication Data

US 2010/0209704 A1    Aug. 19, 2010

(30) Foreign Application Priority Data

Jan. 19, 2009    (JP) .................................. 2009-008437

(51) Int. Cl.
*H05H 1/00* (2006.01)
*H05H 1/20* (2006.01)
*H05H 1/22* (2006.01)
*H05H 1/24* (2006.01)

(52) U.S. Cl.
USPC ........... 427/535; 427/573; 427/576; 977/842; 977/843

(58) Field of Classification Search
USPC ............... 423/447.3, 414, 445 B, 445 R, 448; 427/535, 596, 576, 573; 977/842, 843
See application file for complete search history.

(56) References Cited

U.S. PATENT DOCUMENTS

2006/0210467 A1* 9/2006 Smith et al. ................. 423/447.3
2007/0237704 A1* 10/2007 Dijon et al. ............... 423/445 B
2009/0238996 A1* 9/2009 Nakano et al. ................ 427/569

FOREIGN PATENT DOCUMENTS

JP      2008-280195      11/2008
WO   WO 2007139086 A1 * 12/2007

OTHER PUBLICATIONS

Japanese Office Action for Application No. 2009-008437 mailed on Apr. 26, 2011.
"Single-Walled Carbon Nanotubes Produced by Plasma-Enhanced Chemical Vapor Deposition" by Toshiaki Kato, et al., Chemical Physics Letters 381 (2003) pp. 422-426.
"Low Temperature Synthesis of Extremely Dense and Vertically Aligned Single-Walled Carbon Nanotubes" by Guofang Zhong, et al., Japanese Journal of Applied Physics vol. 44, No. 4A, 2005, pp. 1558-1561.

* cited by examiner

*Primary Examiner* — Michael Wieczorek
(74) *Attorney, Agent, or Firm* — Turocy & Watson, LLP

(57) ABSTRACT

In the growth of carbon nanotubes, the aggregation of catalytic fine particles therefor is a problem. In order to realize the growth of carbon nanotubes into a high density, the carbon nanotube growing process includes a first plasma treatment step of treating a surface having catalytic fine particles with a plasma species generated from a gas which contains at least hydrogen or a rare gas without carbon element, a second plasma treatment step of forming a carbon layer on the surface of the catalytic fine particles by a plasma generated from a gas which contains at least a hydrocarbon after the first plasma treatment step, and a carbon nanotube growing step of growing carbon nanotubes by use of a plasma generated from a gas which contains at least a hydrocarbon after the second plasma treatment step.

4 Claims, 5 Drawing Sheets

CARBON NANOTUBE GROWING PROCESS, AND CARBON NANOTUBE BUNDLE FORMED SUBSTRATE

CROSS-REFERENCE TO RELATED APPLICATION

This application is based upon and claims the benefit of priority from Japanese Patent Applications No. 2009-008437, filed on Jan. 19, 2009, the entire contents of which are incorporated herein by reference.

FIELD OF THE INVENTION

The present invention relates to the production of carbon nanotubes.

BACKGROUND OF THE INVENTION

Attention has been paid to carbon nanotubes as a new material having many excellent characteristics originating from their specific structure.

As a process for growing carbon nanotubes, known are an arc discharge method, a laser ablation method, a liquid phase method and others. From the viewpoint of productivity, controllability and consistency with semiconductor processes, chemical vapor deposition (CVD) is superior. Out of CVD methods, a catalytic CVD method is general, wherein catalytic fine particles made of Fe, Co, Ni or the like are deposited on a substrate, and carbon nanotubes are grown thereon. At present, high-quality carbon nanotubes can be relatively easily obtained, which have a density of the first half of the order of $10^{11}$ cm$^{-2}$.

About the catalytic fine particles, known are a method of depositing fine particles directly onto a substrate by sputtering, an arc plasma gun or the like, and a method of treating a catalytic thin film with plasma to produce fine particles. In order to grow carbon nanotubes so as to have a high density of $10^{12}$ cm$^{-2}$ or more, it is necessary to set the diameter of the catalytic fine particles into a nano-order size. However, it is known that the nano-order size catalytic fine particles are easily aggregated by their high surface energy. The aggregation tends to be made remarkable by external factors in the step of growing the carbon nanotubes, in particular, a raised temperature. Therefore, the growth of carbon nanotubes into a high density of $10^{12}$ cm$^{-2}$ or more is very difficult.

Thus, as a method for restraining the catalyst aggregation, suggested are a method of carrying catalytic fine particles onto a porous material (for example, zeolite) in Chem. Phys. Lett. 381 (2003) 422, a method of adopting a sandwich structure wherein a catalytic layer is sandwiched between Al$_2$O$_3$ layers in Jpn. J. Appl. Phys. 44 (2005) 1558, and other methods. However, even according to these methods, it is difficult to prepare a catalyst having a density of $10^{12}$ cm$^{-2}$ or more. When it is supposed that carbon nanotubes are applied or developed to various articles or purposes, it is preferred that such a carrying material or lamination structure is not used.

SUMMARY OF THE INVENTION

The carbon nanotube growing process of an embodiment of the present invention includes: a first plasma treatment step of treating a catalytic thin film or catalytic fine particles that a substrate surface has with a plasma generated from a gas which contains at least hydrogen gas or a rare gas without carbon element, a second plasma treatment step of forming a carbon layer on the catalytic fine particles by a plasma generated from a gas which contains at least a hydrocarbon after the first plasma treatment step, and a carbon nanotube growing step of treating the catalytic fine particles, on which the carbon layer is formed, with a plasma generated from a gas which contains at least a hydrocarbon after the second plasma treatment step, thereby growing carbon nanotubes.

By subjecting a catalytic thin film or catalytic fine particles to the multistage plasma pretreatment, carbon nanotubes can be grown into a high density.

DETAILED DESCRIPTION OF THE EMBODIMENTS

Figure 1:
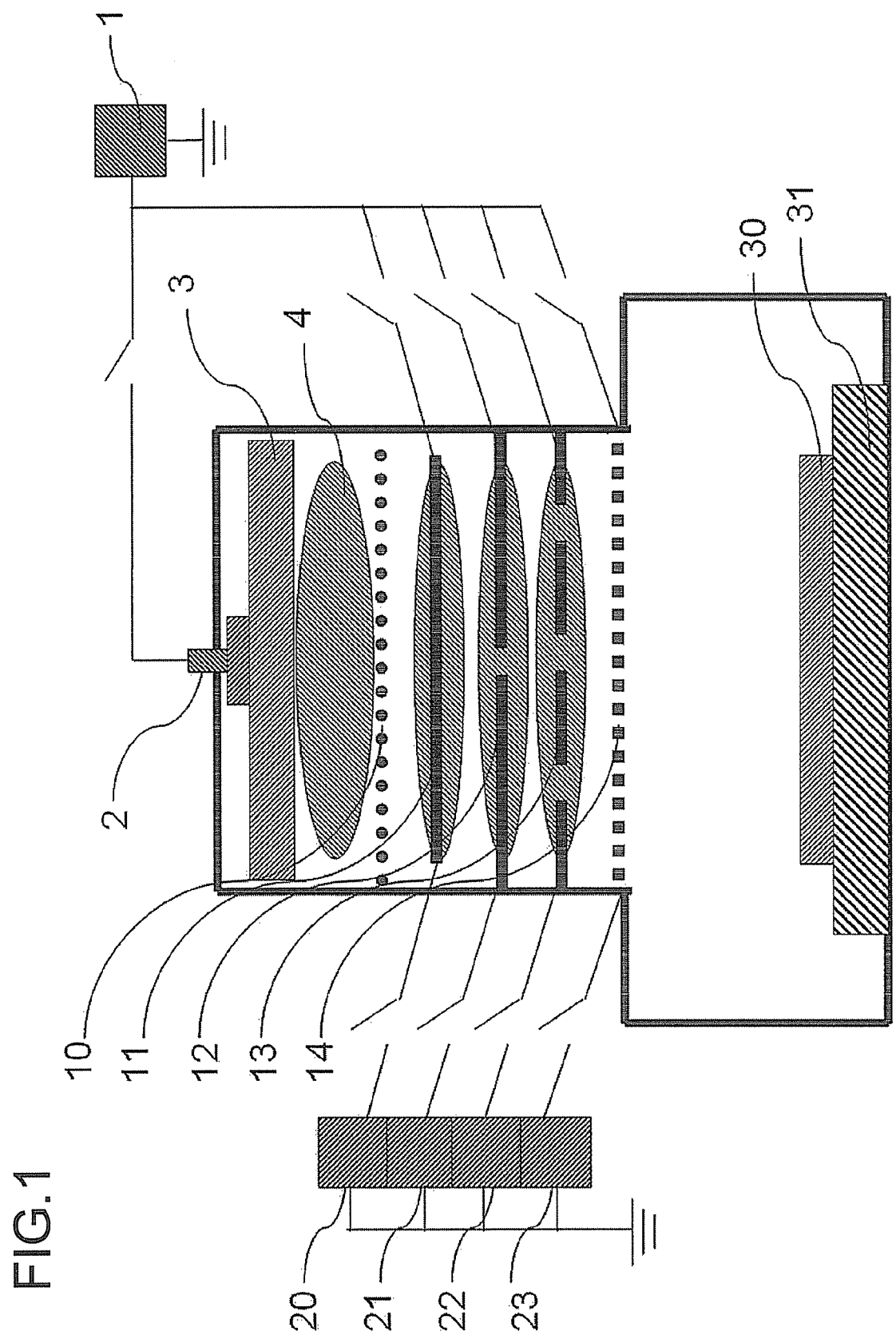
FIG. 1 is a view illustrating an example of a plasma CVD machine used in the invention.

About process for producing carbon nanotubes, the inventors have made various investigations for making the density of carbon nanotubes formed on a substrate high, so as to find out the following method:

A pretreatment method for promoting carbon nanotubes in a carbon nanotube growing process, wherein a multistage plasma treatment is conducted which includes two or more plasma treatment steps that are different from each other in at least one of raw material gas for plasma, plasma intensity, and plasma flux before the carbon nanotubes are grown, thereby restraining the aggregation of catalytic fine particles so as to give good-quality crystal nuclei onto the catalytic fine particles.

First, a catalytic thin film or catalytic fine particles that a substrate surface has are treated with a plasmanized raw material gas containing at least one hydrogen or a rare gas before crystal nuclei of carbon are given thereto, thereby restraining the aggregation of the catalyst fine particles. Hereinafter, this plasma treatment step will be referred to as a first plasma treatment step. In the case of the catalytic thin film, to make the catalyst in the catalytic thin film into fine particles is also conducted in the first plasma treatment step.

Next, the catalytic fine particles, which the substrate surface has, are treated with a plasmanized raw material gas containing at least a hydrocarbon gas before a carbon-nanotube-growing carbon source is supplied thereto, thereby giving crystal nuclei of a graphite layer onto the surface of the catalytic fine particles. Hereinafter, this plasma treatment step will be referred to as a second plasma treatment step.

After the graphite layer is given to the catalytic fine particles, the catalytic fine particles having the graphite layer may be treated with a plasmanized raw material gas containing at least a rare gas without carbon element, thereby making the quality of the carbon crystal of the graphite layer good and activating the catalytic fine particles. Hereinafter, this plasma treatment step will be referred to as a third plasma treatment step.

The inventors have also found out that by optimizing the plasma flux, the plasma intensity and/or the treating temperature in each of the plasma treatment steps, the density of the carbon nanotubes or the spatial occupation ratio thereof is largely increased.

A plasma CVD machine related to the carbon nanotube growing process of an embodiment of the invention has electrodes capable of plasmanizing any introduced raw material gas. A substrate is irradiated with a soft plasma from a region farther from a substrate stage, or is irradiated with a hard plasma from a region near the substrate stage. A DC bias is applied thereto so as to adjust a plasma flux of radicals, ions and so on, thereby making the plasma flux or other conditions appropriate in each of the plasma treatment steps.

The following will describe, in detail, the plasma CVD machine for carbon nanotube growth, and the plasma treatment steps in turn.

First, an example of the plasma CVD machine for carbon nanotube growth, which can attain the plasma treatment steps different from each other in plasma intensity and/or plasma flux by means of the machine alone, is described with reference to FIG. 1, which is a schematic view of the plasma CVD machine example. The plasma CVD machine has, outside its reaction furnace, a plasma-generating power source 1, and plasma-flux-controlling power sources 20 to 23. The machine has, inside the reaction furnace, a substrate 30, a substrate stage 31 on which any substrate is to be set, a gas introducing port 2 for supplying gas into the reaction furnace, an upper electrode 3, which is an electrode for generating plasma in the reaction furnace, and bulkhead electrodes 10 to 14.

In the plasma CVD machine for carbon nanotube growth in the present embodiment, electricity is discharged between its upper electrode, its bulkhead electrode or one of its bulkhead electrodes, which is connected to a AC, DC or pulse power source, and the other electrode (s) that is/are earthed, thereby plasmanizing any raw material gas. About the plasmanized gas, the plasma flux thereof is adjusted in the bulkhead electrode(s), and then catalytic fine particles, which are a matter to be irradiated with the plasma, on a substrate are treated with the plasma.

The operation of the plasma CVD machine illustrated in FIG. 1 is described. First, a raw material gas is introduced through the gas introducing port 2 into the machine. The power source 1 is connected to the upper electrode 2 or one of the bulkhead electrodes 10 to 14, and voltage is applied thereto. The bulkhead electrodes not connected to the power sources 1 are earthed, and electricity is discharged between the electrode connected to the power source 1 and the earthed electrodes to plasma the raw material gas. The plasma includes a plasma flux of ions, radicals, electrons and some other. The density of such a plasma flux is adjusted by a method described below, and a member to be irradiated with the plasma is irradiated therewith. The method for adjusting the plasma flux density is specifically a method of connecting a DC bias power source to the bulkhead electrode(s) nearer to the substrate stage than the electrode for generating the plasma, and next applying a voltage (to such a degree that the plasma is not generated) of −100 V or more and +100 V or less to the bulkhead electrode connected to the DC bias power source, thereby controlling the ion density and the electron density by the DC bias.

Bias electrodes different from each other may be applied to the plural bulkhead electrodes.

In the plasma CVD machine in the embodiment, its bulkhead electrode(s) (each) has/have a hole or holes. In a case where the machine has plural bulkhead electrodes, it is preferred that the size and the number of the hole(s) in the bulkhead electrode(s) nearer to its substrate stage are smaller and larger, respectively, than the size and the number of the hole(s) in the bulkhead electrode(s) nearer to its upper electrode. Furthermore, it is preferred that a plasma flux with which the substrate stage is to be irradiated is rectified. It is allowable only to rectify the plasma flux without applying any DC bias to the bulkhead electrode(s).

In the CVD machine illustrated in FIG. 1, the number of the bulkhead electrodes is five; however, the number of the bulkhead electrodes may be selected at will in accordance with the purpose of the plasma treatment.

Examples of the material of one or more bulkhead electrodes of the plasma CVD machine in the embodiment include Mo, Cu, Ti, Ta, W and SUS. Of these examples, W is preferred since W is high in sputtering resistance and low in resistance.

In the plasma CVD machine in the embodiment, the intensity of plasma with which a substrate is irradiated can be adjusted by adjusting the distance between its electrode for plasmanization and the substrate. Specific and preferred examples of the method therefor include a method of making the distance between the electrode for plasmanization and a substrate stage large, thereby generating a plasma the species of which has a low density (a soft plasma), and a method of making the distance between the electrode for plasmanization and the substrate stage small, thereby generating a plasma the species of which has a high density (a hard plasma).

The method for adjusting the irradiation intensity of the plasma may be a method of selecting the position of the electrode for generating the plasma, or any other method. Specifically, it is allowable that as illustrated in a schematic view of FIG. 2, a shifting unit 40 is set to a substrate stage 31, thereby preparing a mechanism wherein the substrate stage 31 can be shifted upward and downward, that is, toward the electrode side and backward so that the distance between an electrode for plasmanization and the substrate stage 31 is adjusted.

Figure 2:
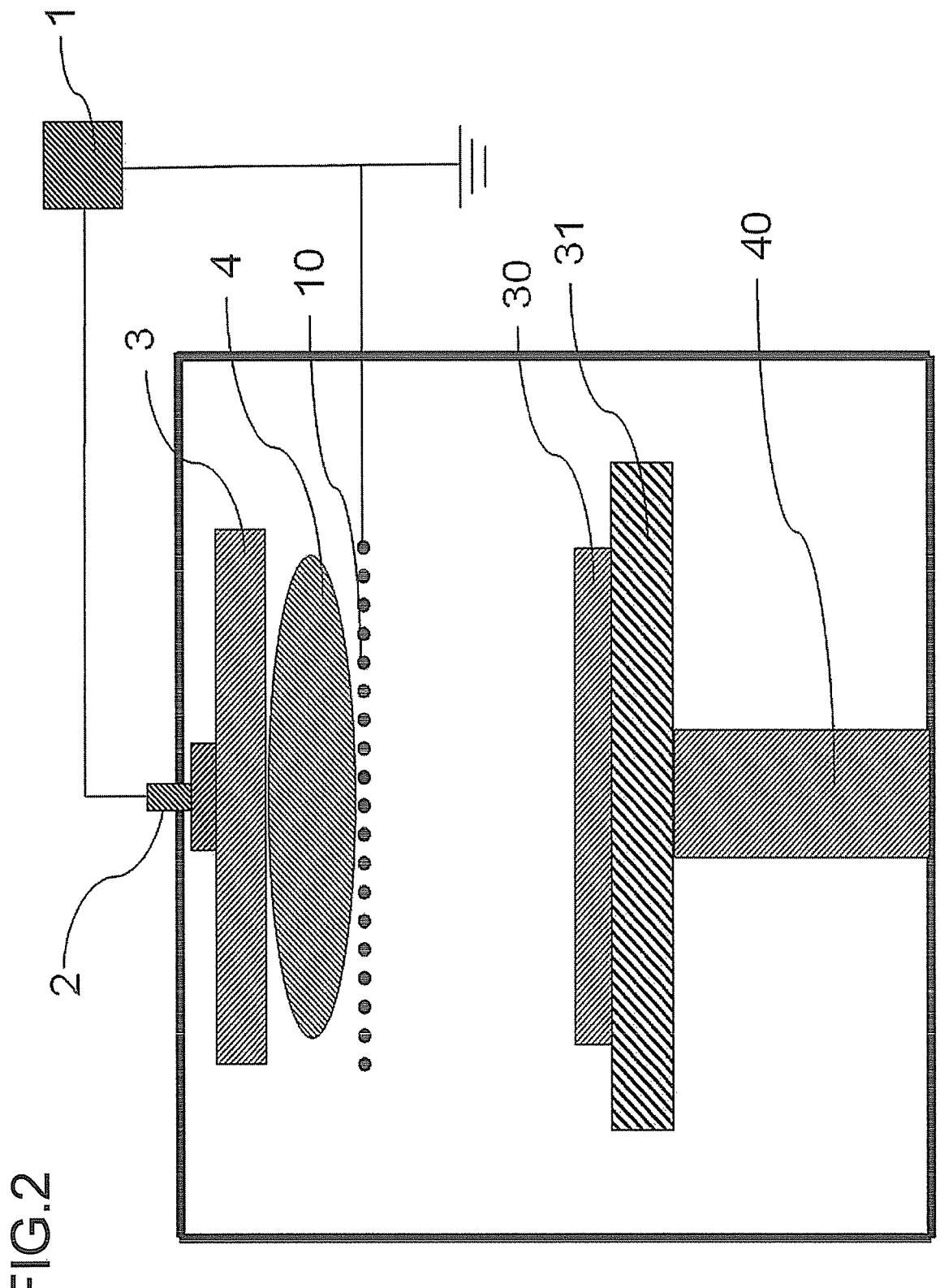
FIG. 2 is a view illustrating another example of the plasma CVD machine used in the invention.

In the plasma CVD machine illustrated in FIG. 1 or 2, the substrate stage 31 has a heating mechanism. The mechanism is a mechanism capable of setting the temperature of the substrate to an appropriate temperature in accordance with individual treatment conditions.

The following will describe the plasma treatment steps.

In the first plasma treatment step, a raw material gas containing at least hydrogen gas and/or a rare gas without carbon element is plasmanized, and catalytic fine particles carried on a substrate surface are treated with the plasma to restrain the aggregation of the catalytic fine particles. The raw material gas may contain nitrogen, ammonia and/or the like besides hydrogen gas and/or the rare gas.

In the first plasma treatment step, the treating temperature is preferably 25° C. (room temperature) or higher and 300° C. or lower since the effect of restraining the aggregation of the catalytic fine particles is high as the treating temperature is as low as possible. If the treating temperature is higher than 300° C., the treatment is unfavorably applied to the catalytic fine particles in the state that the aggregation of the particles advances.

In the first plasma treatment step, the reaction time is preferably 0.1 minute or more and 60 minutes or less in order to cause the catalyst activity to be kept. The reaction time in the case of a soft plasma and that in the case of a hard plasma are desirably made longer and shorter, respectively, than the middle in this range. In the first plasma treatment step, the plasma power ranges preferably from 10 to 300 W.

In order to conduct the treatment optimally to concave regions, it is preferred that the treatment is conducted with a hard plasma. Accordingly, in the case of the example of the CVD machine illustrated in the schematic view of FIG. 1, it is preferred to plasmanize the raw material gas between lower ones of the bulkhead electrodes, for example, connect the power source 1 to the bulkhead electrode 14, earth the bulkhead electrode 13, and plasmanize the raw material gas between the bulkhead electrodes 13 and 14. The first plasma treatment step may be conducted plural times. However, it is necessary to conduct the step to such a degree that the catalyst activity is not affected.

When the densities of ions and electrons in the plasma are made low in the first plasma treatment step, the following is preferred in the case of the example of the CVD machine illustrated in the schematic view of FIG. 1: the DC bias power sources 20 to 23 are connected to the bulkhead electrodes 11 to 14, respectively, and a DC bias of −100 V or more and +100 V or less is applied to each of the electrodes. In this case, it is preferred that the DC bias applied to a lower bulkhead electrode out of the bulkhead electrodes is made smaller. In some cases, it may be preferred to irradiate the substrate with radicals having a high ion density and high electron density. When the power source 1 is connected to the bulkhead electrode 14 and the bulkhead electrode 13 is earthed, the hardest plasma can be emitted.

In the second plasma treatment step, the catalytic fine particles carried on the substrate surface are subjected to plasma treatment with a plasma generated from a discharge gas containing at least a hydrocarbon to form a graphite layer having a size of several nanometers on the catalytic fine particles. The formed graphite layer is to be crystal nuclei for carbon nanotube growth. The raw material gas is preferably a gas made of at least one selected from the group consisting of methane, acetylene, benzene, and alcohols (such as ethanol). The raw material gas may contain nitrogen, carbon dioxide, a rare gas and/or the like besides the hydrocarbon.

The treating temperature in the step is preferably 150° C. or higher and 600° C. or lower since the temperature needs to be a temperature lower than the temperature for carbon nanotube growth and be further a temperature permitting the graphite layer to be formed. It is sufficient in the second plasma treatment step that the graphite layer is formed to have a thickness of several nanometers. Thus, it is sufficient therein that the treating time is short, specifically, the time is from about 0.1 to 5 minutes. If the treating time is long, the catalyst activity falls, the graphite layer low in crystallinity becomes too long and some other unfavorable result is caused since the low-temperature treatment is conducted.

The second plasma treatment step may be conducted plural times while the treating temperature is varied or some other manner is adopted. However, if the total treating time becomes too long, the crystallinity of the graphite layer declines. Thus, the step needs to be conducted to such a degree that the crystallinity of the graphite layer (seed crystal) does not decline.

In the case of the example of the CVD machine illustrated in the schematic view of FIG. 1, it is preferred in the second plasma treatment step to connect the DC bias power sources 20 to 23 to the bulkhead electrodes 11 to 14, respectively, apply a DC bias of −100 V or more and +100 V or less to each of the electrodes 11 to 14 so as to remove ions and electrons from the plasma, and then irradiate the substrate having a surface on which the catalytic fine particles are carried, as a member to be irradiated with the plasma, with radical species.

According to the treatment with the radical species, factors which hinder the growth (ions and electrons) are not used; thus, it is preferred to treat the substrate with a soft plasma. In the second plasma treatment step, the plasma power ranges preferably from 10 to 100 W.

In the third plasma treatment step, the catalytic fine particles, on which the graphite layer (seed crystal) is formed, on the substrate are subjected to plasma treatment, thereby activating the catalytic fine particles and improving the quality of the crystal nuclei. A raw material gas used therefor is at least one rare gas selected from the group consisting of argon, helium, neon, and xenon. The raw material gas may contain nitrogen, hydrogen, water and/or the like beside the rare gas.

In the third plasma treatment step, the treating temperature is preferably not lower than the treating temperature in the third plasma treatment step and not higher than the carbon nanotube growing temperature. In order to make the quality of the crystal nuclei good, it is more preferred that the treating temperature is higher. Considering these two matters, the treating temperature in the third plasma treatment step is preferably 400° C. or higher and 1000° C. or lower. In the third plasma treatment step, the plasma power ranges preferably from 10 to 100 W.

In order to obtain high-quality carbon nanotubes, in the third plasma treatment step, it is preferred to treat the workpiece with a soft plasma. Accordingly, in the case of the example of the CVD machine illustrated in the schematic view of FIG. 1, it is preferred to plasmanize a' raw material gas between upper ones of the bulkhead electrodes, for example, connect the power source 1 to the upper electrode 3, earth the bulkhead electrode 10, and plasmanize the raw material gas between the upper electrode 3 and the bulkhead electrode 10.

In the case of the example of the CVD machine illustrated in the schematic view of FIG. 1, in the third plasma treatment step, it is preferred to connect the DC bias power source 23 to the bulkhead electrode 14, apply a DC bias voltage of −100 V or more and 0 V or less so as to remove ions and electrons from the plasma, and then irradiate the substrate, as a member to be irradiated with the plasma, with radical species. The treatment with the radical species favorably results in the growth of high-quality carbon nanotubes.

The catalytic fine particles carried on the substrate surface may be subjected to halogen treatment after the second or third plasma treatment step, thereby adding modifying groups onto the graphite layer formed on the catalytic fine particles. The catalytic fine particles are treated with a plasma using a discharge gas containing a halogen such as $F_2$ or $Cl_2$. The treating temperature is preferably 400° C. or higher and 1000° C. or lower.

In order not to damage the crystallinity of the crystal nuclei or the catalyst activity, the halogen treatment step is preferably conducted with a soft plasma. Accordingly, in the case of the example of the CVD machine illustrated in the schematic view of FIG. 1, it is preferred to plasmanize a raw material gas between upper ones of the bulkhead electrodes, for example, connect the power source 1 to the upper electrode 3, earth the bulkhead electrode 10, and plasmanize the raw material gas between the upper electrode 3 and the bulkhead electrode 10. The halogen treatment step may be conducted plural times. However, the step needs to be conducted to such a degree that the crystallinity of the crystal nuclei and the catalyst activity are not affected. In order to give plural halogen atoms to the workpiece, the treatment may be conducted under separate appropriate conditions.

In the case of using a thin film as the catalyst, treatment for making the catalyst into fine particles and treatment for restraining the aggregation of the particles are simultaneously conducted in the first plasma treatment step. The treating temperature therefor is preferably 25° C. or higher and 300° C. or lower to give the restraining effect before the aggregation advances. If the temperature is higher than 300° C., the aggregation unfavorably advances too much.

In the case of conducting the activating-group-giving treatment after the carbon nanotube growing pretreatment is conducted, the workpiece is treated with a plasma generated from a raw material gas containing a hydrocarbon after the activating-group-giving treatment, thereby growing carbon nanotubes. It is preferred that the hydrocarbon contained in the raw material gas is specifically at least one selected from the group consisting of methane, benzene, acetylene and alcohols (such as ethanol). The raw material gas may contain hydrogen, nitrogen, water and/or the like beside the hydrocarbon.

In the carbon nanotube growing step, the treating temperature is preferably 300° C. or higher and 1000° C. or lower. If the temperature is lower than 300° C., the crystallinity unfavorably declines. If the temperature is higher than 1000° C., the substrate on which the catalyst can be carried is unfavorably limited. In the carbon nanotube growing step, the plasma power ranges preferably from 10 to 50 W.

The treatment in the carbon nanotube growing step is preferably conducted with a soft plasma to yield high-quality carbon nanotubes. Therefore, in the case of the example of the CVD machine illustrated in the schematic view of FIG. 1, it is preferred to plasmanize the raw material gas between upper ones of the bulkhead electrodes, for example, connect the power source 1 to the upper electrode 3, earth the bulkhead electrode 10, and plasmanize the raw material gas between the upper electrode 3 and the bulkhead electrode 10.

In the case of the example of the CVD machine illustrated in the schematic view of FIG. 1, it is preferred in the carbon nanotube growing step to connect the DC bias power source 23 to the bulkhead electrode 14, apply a DC bias of −100 V or more and 0 V or less thereto so as to remove ions and electrons from the plasma, and then irradiate the substrate, as a member to be irradiated with the plasma, with radical species. By the treatment with the radical species, high-quality carbon nanotubes favorably grow.

A carbon nanotube bundle formed substrate obtained by the carbon nanotube growing process of the embodiment satisfies the following numerical expressions (1) or (2) about the density ρ ($cm^{-2}$) of the carbon nanotubes and the spatial occupation ratio A (%) of the carbon nanotubes:

$$\rho \geq \frac{1}{\sqrt{3}} \frac{5 \times 10^{13}}{(d+0.34)^2} \quad (1)$$

wherein d represents the average diameter (nm) of the carbon nanotubes.

$$A = \frac{\pi \times r^2 \times \rho \times 100}{10^{14}} \geq 10 \quad (2)$$

wherein r represents the average diameter (nm) of the carbon nanotubes.

Hereinafter, examples of the invention will be described with reference to the drawings.

Example 1

One of the examples is herein described wherein the CVD machine illustrated in FIG. 1 was used. A substrate wherein a Co thin film (thickness: 0.5 nm) was formed on a TiN/$SiO_2$ film by sputtering was put onto a substrate stage, and the substrate was irradiated with hydrogen plasma (pressure: 5 Torr) generated between the upper electrode and the first bulkhead electrode at 260° C. for 5 minutes for a first plasma treatment. About the power source, the pulse frequency, the pulse width and the voltage were set to 8 kHz, 0.8 μs, and ±700 V, respectively. The second to fifth bulkhead electrodes were earthed. Thereafter, the used gas was changed from hydrogen to a methane/hydrogen mixed gas, the temperature was raised to 350° C., and then a second plasma treatment was conducted. The plasma therefor was generated between the upper electrode and the first bulkhead electrode. The pressure was set to 5 Torr. About the power source, the pulse frequency, the pulse width and the voltage were set to 20 kHz, 2 μs, and ±700 V, respectively. A DC bias of −25 V was applied to each of the second to fifth bulkhead electrodes to remove ions and electrons. In this way, only radical species were supplied thereto. The treating time was 30 seconds. Finally, a carbon nanotube growing step was conducted at 450° C. for 30 minutes. The pressure was set to 5 Torr. About the power source, the pulse frequency, the pulse width and the voltage were set to 20 kHz, 2 μs and ±700 V, respectively. In order to make the plasma power lower, a resistance of 5 kΩ was connected to the power source in series to decrease the generation amounts of ions, electrons, and the radical species. Furthermore, a DC bias of −25 V was applied to each of the second to fifth bulkhead electrodes to remove ions and electrons selectively, thereby supplying an appropriate amount of the radical species to the substrate.

Figure 3A:
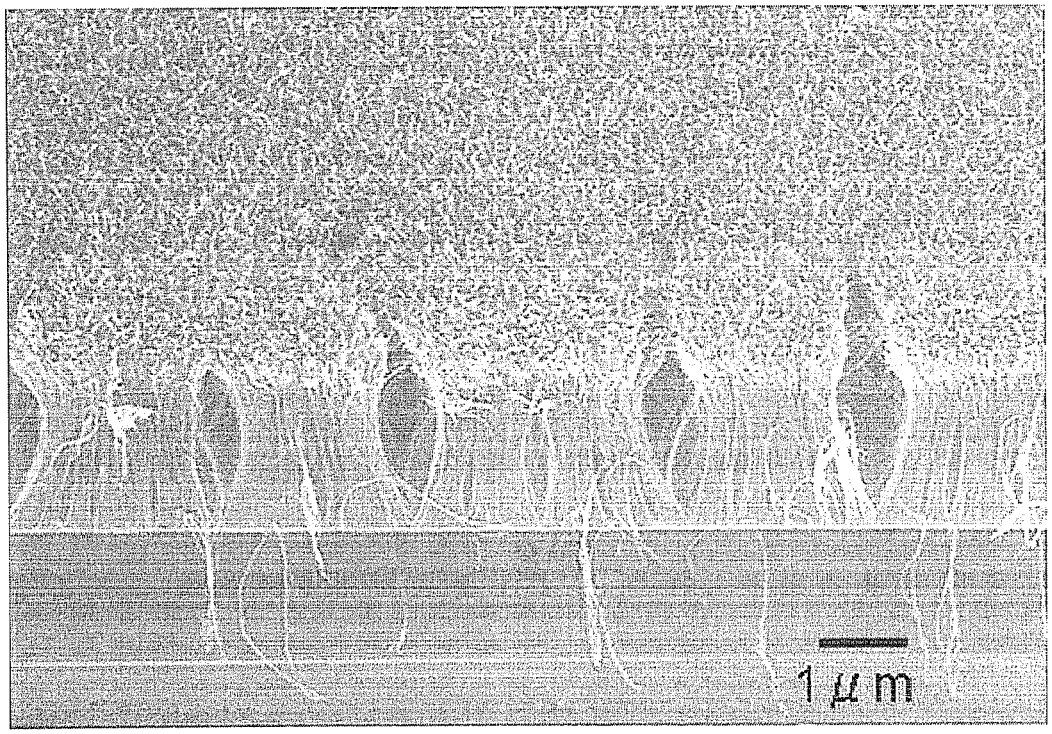
FIG. 3 is a high-resolution electron microscopic photograph of a carbon nanotube bundle formed substrate produced by a process of Example 1.
Figure 3B:
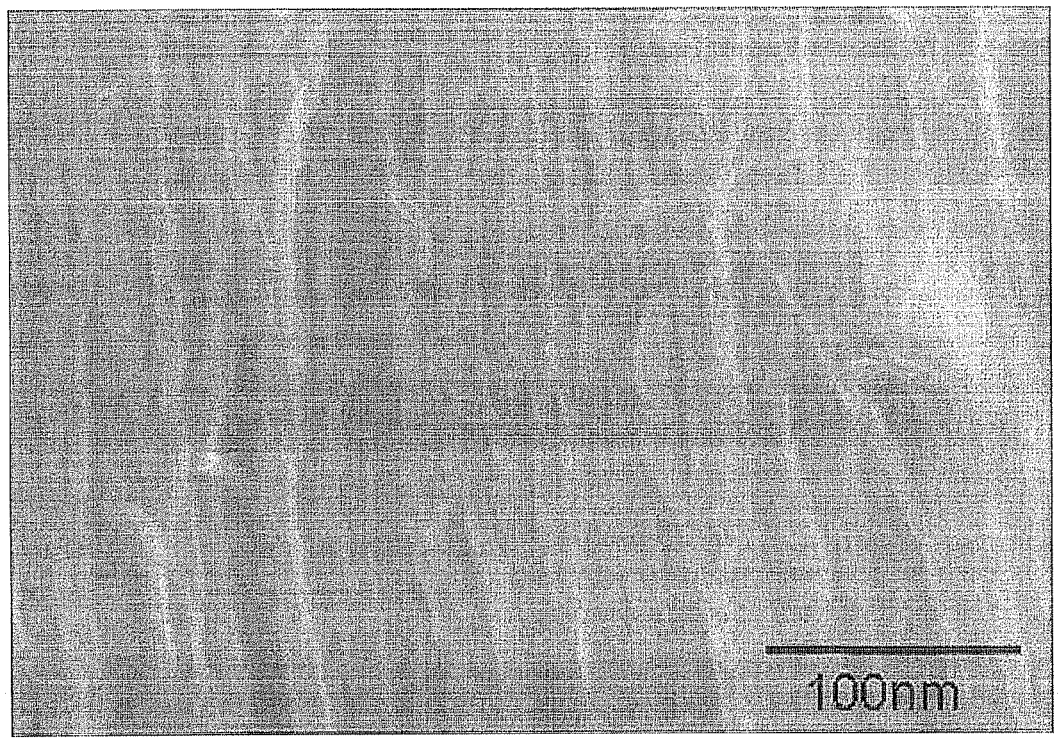

A high-resolution scanning electron microscopic photograph of the produced carbon nanotube bundle formed substrate is shown in FIG. 3. From the high-resolution SEM photograph, the average diameter thereof was from 6 to 7 nm. From a comparison of a region where the bundles were densest with a region of their roots, it was also presumed that the average density was a half of the theoretical density. As a result, the density was $1 \times 10^{12}$ $cm^{-2}$ and the spatial occupation ratio was 33%. Thus, the numerical expressions (1) and (2) were satisfied.

In any example equivalent to the present example, the third plasma treatment may be conducted after the second plasma treatment in order to make the quality of the carbon crystal of the graphite layer good and activate the catalytic fine particles.

Example 2

A carbon nanotube bundle formed substrate was produced in the same way as in Example 1 except that the discharge gas in the first plasma treatment step was changed to a rare gas (argon), the treating temperature and time were set to room temperature and 2 minutes, respectively, and the carbon nanotube growing temperature was set to 500° C.

Figure 4:
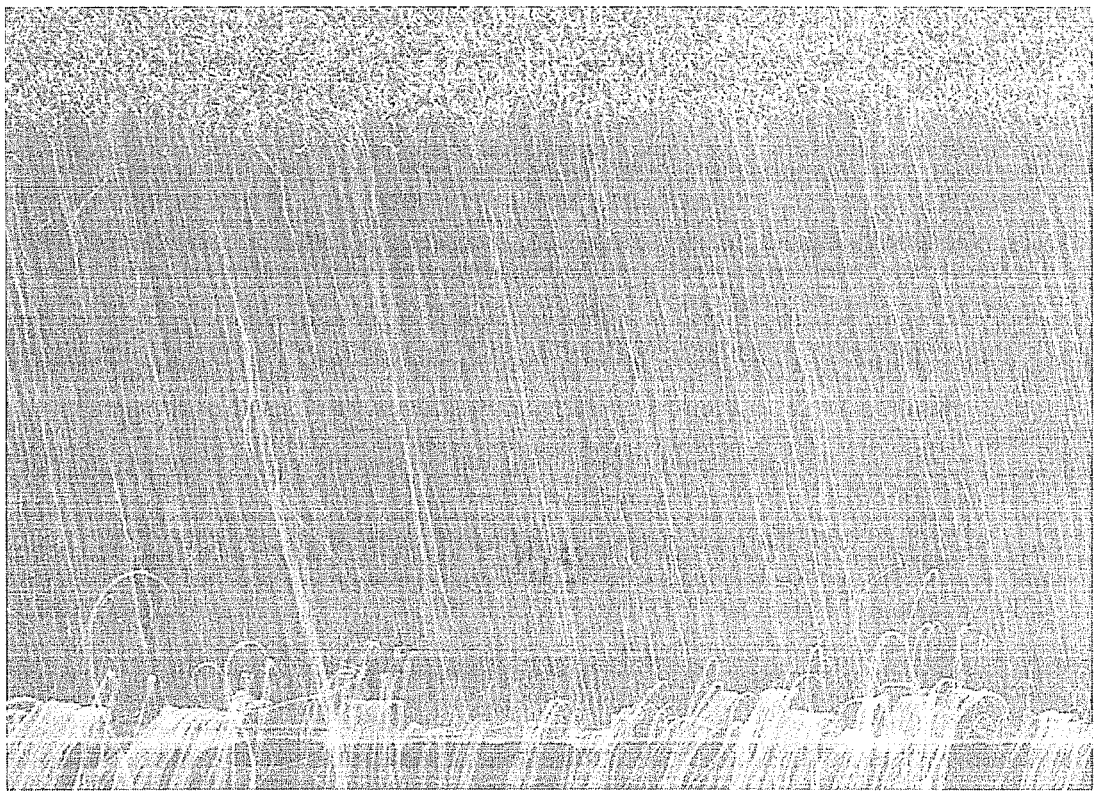
FIG. 4 is a high-resolution electron microscopic photograph of a carbon nanotube bundle formed substrate produced by a process of Example 2.

A high-resolution electron microscopic photograph of the produced carbon nanotube bundle formed substrate is shown in FIG. 4. From the high-resolution SEM photograph, the density and the spatial occupation ratio were $8 \times 10^{11}$ $cm^{-2}$ and 35%, respectively. Thus, the numerical expressions (1) and (2) were satisfied (average diameter: 7 to 8 nm).

In any example equivalent to the present example, the third plasma treatment may be conducted after the second plasma treatment in order to make the quality of the carbon crystal of the graphite layer good and activate the catalytic fine particles.

Example 3

One of the examples is herein described wherein the CVD machine illustrated in FIG. 2 was used. A substrate wherein a Co thin film (thickness: 0.5 nm) was formed on a TiN/SiO$_2$ film by sputtering was put onto a substrate stage, and the substrate was irradiated with argon plasma (pressure: 5 Torr) at room temperature for 5 minutes for a first plasma treatment. About the power source, the pulse frequency, the pulse width and the voltage were set to 8 kHz, 0.8 μs, and ±700 V, respectively. The upward and downward shifting mechanism was used to set the distance between the plasma and the substrate to 20 mm. Thereafter, the used gas was changed from argon to a methane/hydrogen mixed gas, the temperature was raised to 350° C., and then a second plasma treatment was conducted. The distance between the plasma and the substrate was set to 100 mm. The pressure was set to 5 Torr. About the power source, the pulse frequency, the pulse width and the voltage were set to 20 kHz, 2 μs, and ±700 V, respectively. The treating time was 30 seconds. Finally, a carbon nanotube growing step was conducted at 450° C. for 30 minutes. The distance between the plasma and the substrate was set to 100 mm. The pressure was set to 5 Torr. About the power source, the pulse frequency, the pulse width and the voltage were set to 20 kHz, 2 μs, and ±700 V, respectively.

The carbon nanotube bundle formed substrate produced in Example 3 satisfied the numerical expressions (1) and (2) about the density and the spatial occupation ratio.

In any example equivalent to the present example, the third plasma treatment may be conducted after the second plasma treatment in order to make the quality of the carbon crystal of the graphite layer good and activate the catalytic fine particles.

Example 4

A substrate wherein a Co thin film (thickness: 0.5 nm) was formed on a TiN/SiO$_2$ film by sputtering was put onto a substrate stage, and the substrate was irradiated with argon plasma (pressure: 5 Torr) at room temperature for 5 minutes for a first plasma treatment. About the power source, the pulse frequency, the pulse width and the voltage were set to 8 kHz, 0.8 μs, and ±700 V, respectively. The upward and downward shifting mechanism was used to set the distance between the plasma and the substrate to 20 mm. Thereafter, the used gas was changed from argon to a methane/hydrogen mixed gas, the temperature was raised to 350° C., and then a second plasma treatment was conducted. The distance between the plasma and the substrate was set to 100 mm. The pressure was set to 5 Torr. About the power source, the pulse frequency, the pulse width and the voltage were set to 20 kHz, 2 μs, and ±700 V, respectively. The treating time was 30 seconds. A Cl$_2$ gas was used to conduct halogen treatment. The treating temperature and time were set to 450° C. and 30 seconds, respectively. Finally, a carbon nanotube growing step was conducted at 450° C. for 30 minutes. The distance between the plasma and the substrate was set to 100 mm. The pressure was set to 5 Torr. About the power source, the pulse frequency, the pulse width and the voltage were set to 20 kHz, 2 μs, and ±700 V, respectively. In order to make the plasma power lower, a resistance of 5 kΩ was connected to the power source in series.

The carbon nanotube bundle formed substrate produced in Example 4 satisfied the numerical expressions (1) and (2) about the density and the spatial occupation ratio.

In any example equivalent to the present example, the third plasma treatment may be conducted after the second plasma treatment in order to make the quality of the carbon crystal of the graphite layer good and activate the catalytic fine particles.

Comparative Example 1

A carbon nanotube formed substrate was produced in the same way as in Example 1 except the first plasma treatment step was not conducted.

Figure 5:
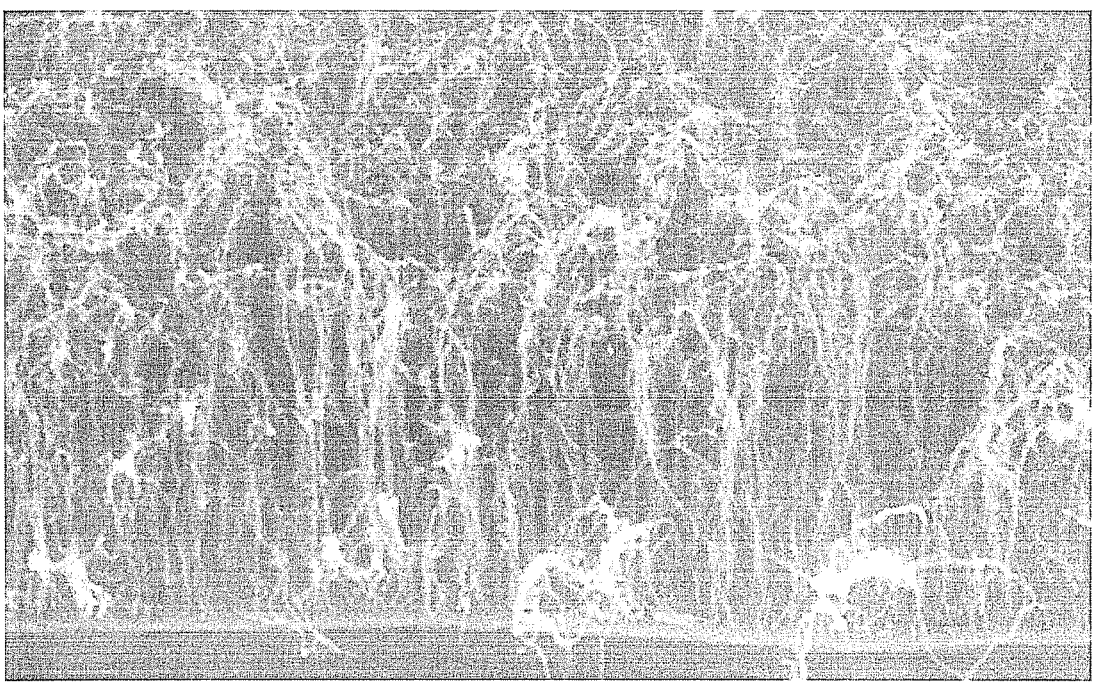
FIG. 5 is a high-resolution electron microscopic photograph of a carbon nanotube bundle formed substrate produced by a process of Comparative Example 1.

A high-resolution electron microscopic photograph of the produced carbon nanotube formed substrate is shown in FIG. 5. Since the first plasma treatment step was not conducted, the catalyst particles aggregated so that the density unfavorably lowered. It was presumed that the average diameter was 5 nm, and the density and the spatial occupation ratio were about $1 \times 10^{11}$ cm$^{-2}$ and about 2%, respectively. The carbon nanotube formed substrate neither satisfied the numerical expression (1) nor (2).

Comparative Example 2

A carbon nanotube formed substrate was produced in the same way as in Example 1 except the second plasma treatment step was not conducted.

Figure 6:
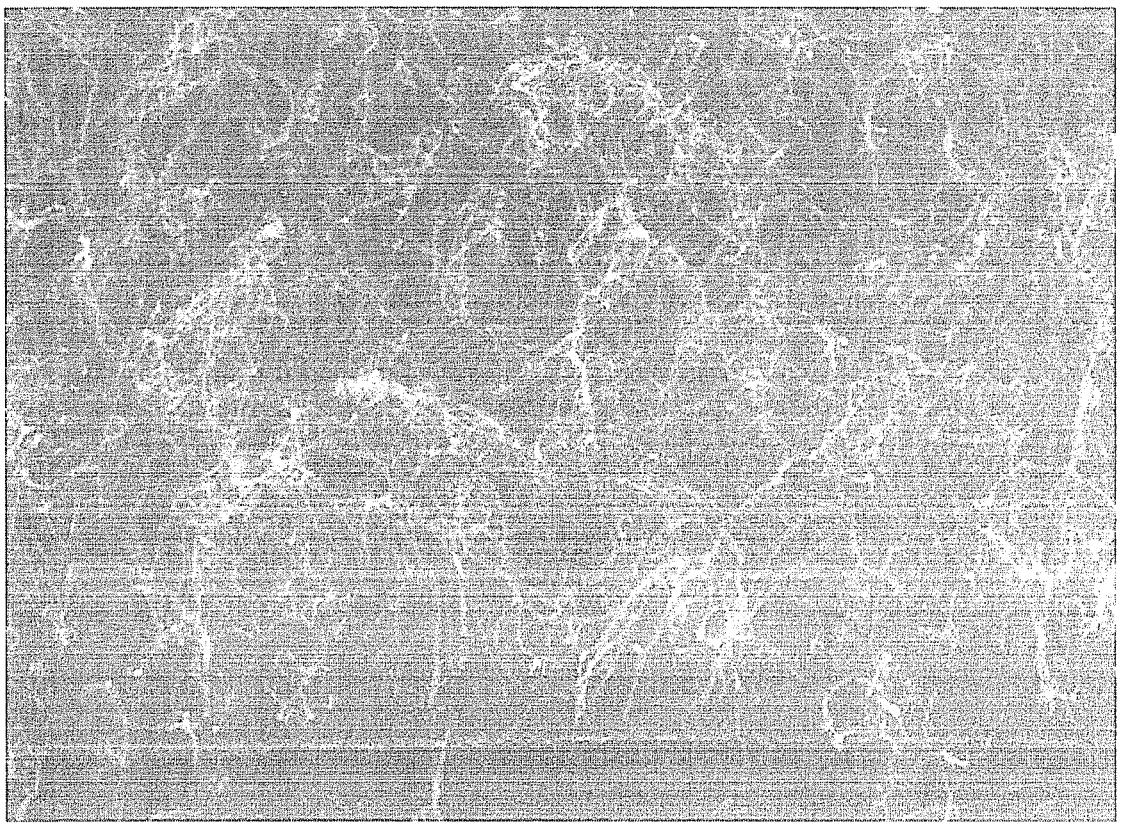
FIG. 6 is a high-resolution electron microscopic photograph of a carbon nanotube bundle formed substrate produced by a process of Comparative Example 2.

A high-resolution electron microscopic photograph of the produced carbon nanotube formed substrate is shown in FIG. 6. The second plasma treatment step was not conducted, so that the carbon nanotube generation rate considerably lowered. Thus, only sparse carbon nanotubes were obtained. The carbon nanotube formed substrate did not satisfy the numerical expression (1) or (2) at all.

According to the high-density carbon nanotube bundle formed substrates produced in Examples, a carbon nanotube density that is of the order of $10^{12}$ cm$^{-2}$ and satisfies the numerical expression (1) is realized by their multi-layered carbon nanotubes (diameter: 6 to 8 nm). In the case of converting this into the spatial occupation ratio, the ratio reaches to 30 to 40%. This is a value one digit higher than spatial occupation ratios according to the prior art. A carbon nanotube bundle formed substrate having such a high spatial occupation ratio can be applied to high current-density wiring, a high thermal-conductivity heat sink, or the like.

The invention has been described on the supposition that carbon nanotubes are caused to grow; besides, in the growth of an organic material, low-damage etching, resist ashing, surface cleaning or the like, plasma treatment may be conducted plural times according to the process of the embodiment and any machine used in the process.

What is claimed is:

1. A carbon nanotube growing process, comprising:
    a first plasma treatment step of treating a catalytic thin film or catalytic fine particles on a substrate surface with a plasma generated from a gas which contains at least hydrogen gas or a rare gas without carbon element,
    a second plasma treatment step of forming a carbon layer on the catalytic thin film or the catalytic fine particles by a plasma generated from a gas which contains at least a hydrocarbon after the first plasma treatment step,
    a third plasma treatment step of treating the catalytic thin film or the catalytic fine particles, on which the carbon layer is formed, with a plasma generated from a gas which contains at least a rare gas without carbon element at a treating temperature between 150° C. and 600° C. after the second plasma treatment step and before the carbon nanotube growing step, and
    a carbon nanotube growing step of treating the catalytic thin film or the catalytic fine particles, on which the carbon layer is formed, with a plasma generated from a gas which contains at least a hydrocarbon after the third plasma treatment step, thereby growing carbon nanotubes.

2. The process according to claim 1, wherein the plasma in the first plasma treatment step is of an ionic species and a radical species, or of a radical species, and
    the plasma in the second plasma treatment step is of a radical species.

3. The process according to claim 1, wherein the treating temperature in the first plasma treatment step is between 25° C. and 300° C.,
    the treating temperature in the second plasma treatment step is between 150° C. and 600° C., and
    the treating temperature in the carbon nanotube growing step is between 300° C. and 1000° C.

4. The process according to claim 1,
    wherein about the distance between a region where the gas in each of the first to third plasma treatment steps is plasmanized and the catalytic thin film or the catalytic fine particles irradiated with the plasma, the distances set in the first and second plasma treatment steps are each equal to or shorter than the distance set in the third plasma treatment step.

\* \* \* \* \*